(12) United States Patent
Cox et al.

(10) Patent No.: US 9,293,553 B2
(45) Date of Patent: Mar. 22, 2016

(54) GRAPHENE ELECTRODES FOR ELECTRONIC DEVICES

(75) Inventors: Marshall Cox, Brooklyn, NY (US);
Ioannis Kymissis, New York, NY (US);
Alon Gorodetsky, New York, NY (US);
Melinda Y. Han, New York, NY (US);
Colin P. Nuckolls, New York, NY (US);
Philip Kim, New York, NY (US)

(73) Assignee: The Trustees of Columbia University in the City of New York, New York, NY (US)

(*) Notice: Subject to any disclaimer, the term of this patent is extended or adjusted under 35 U.S.C. 154(b) by 0 days.

(21) Appl. No.: 14/004,220

(22) PCT Filed: Mar. 8, 2012

(86) PCT No.: PCT/US2012/028299
§ 371 (c)(1),
(2), (4) Date: Mar. 17, 2014

(87) PCT Pub. No.: WO2012/122387
PCT Pub. Date: Sep. 13, 2012

(65) Prior Publication Data
US 2014/0183736 A1    Jul. 3, 2014

Related U.S. Application Data

(60) Provisional application No. 61/451,329, filed on Mar. 10, 2011.

(51) Int. Cl.
*H01L 29/45* (2006.01)
*H01L 51/00* (2006.01)
(Continued)

(52) U.S. Cl.
CPC ............... *H01L 29/45* (2013.01); *B82Y 10/00* (2013.01); *H01L 21/283* (2013.01);
(Continued)

(58) Field of Classification Search
CPC .... H01L 29/45; H01L 51/442; H01L 51/4246; H01L 51/0045; H01L 31/0224
USPC .......... 257/741, 750; 977/742, 746, 748, 750, 977/954, 932
See application file for complete search history.

(56) References Cited

U.S. PATENT DOCUMENTS 7,745,047 B2    6/2010   Zhamu et al.
7,785,557 B2    8/2010   Gruner et al.
(Continued)

FOREIGN PATENT DOCUMENTS

WO    WO-2010029542 A1    3/2010
WO    WO-2012122387 A1    9/2012

OTHER PUBLICATIONS

"International Application Serial No. PCT/US2012/028299, International Preliminary Report on Patentability mailed Sep. 19, 2013", 7 pgs.

(Continued)

*Primary Examiner* — Michele Fan
(74) *Attorney, Agent, or Firm* — Schwegman Lundberg & Woessner, P.A.

(57) ABSTRACT

A laminated graphene device is demonstrated as a cathode. In one example the devices include organic photovoltaic devices. The measured properties demonstrate work-function matching via contact doping. Devices and method shown also provide increased power conversion efficiency due to transparency. These findings indicate that flexible, light-weight all carbon devices, such as solar cells, can be constructed using graphene as the cathode material.

21 Claims, 4 Drawing Sheets

(51) Int. Cl.
*H01L 51/44* (2006.01)
*H01L 21/283* (2006.01)
*B82Y 10/00* (2011.01)
*H01L 51/42* (2006.01)
*H01L 51/50* (2006.01)

(52) U.S. Cl.
CPC ......... *H01L 51/0045* (2013.01); *H01L 51/442* (2013.01); *H01L 51/0037* (2013.01); *H01L 51/0046* (2013.01); *H01L 51/4246* (2013.01); *H01L 51/5096* (2013.01); *H01L 2251/308* (2013.01); *Y02E 10/549* (2013.01)

(56) References Cited

U.S. PATENT DOCUMENTS

| | | | |
|---|---|---|---|
| 7,834,545 B2 | 11/2010 | Zhang et al. | |
| 7,872,334 B2* | 1/2011 | Chen et al. | 257/653 |
| 9,157,023 B2* | 10/2015 | Boerner | C07F 15/0033 |
| 2001/0051285 A1* | 12/2001 | Shi | H01L 51/005 428/690 |
| 2005/0064235 A1* | 3/2005 | Liao | H01L 51/5012 428/690 |
| 2006/0172147 A1* | 8/2006 | Matsuura | H01L 51/5036 428/690 |
| 2006/0264143 A1* | 11/2006 | Lee et al. | 445/24 |
| 2007/0096086 A1 | 5/2007 | Wang et al. | |
| 2008/0170982 A1 | 7/2008 | Zhang et al. | |
| 2008/0303427 A1* | 12/2008 | Johansson et al. | 313/504 |
| 2008/0309222 A1* | 12/2008 | Thompson | C07C 13/567 313/504 |
| 2009/0032808 A1* | 2/2009 | Bazan et al. | 257/40 |
| 2009/0169921 A1* | 7/2009 | Cheng | C07C 15/38 428/690 |
| 2009/0308456 A1* | 12/2009 | Rand | H01L 51/0038 136/261 |
| 2010/0051902 A1* | 3/2010 | Hiura et al. | 257/13 |
| 2010/0089443 A1* | 4/2010 | Bloomstein et al. | 136/255 |
| 2010/0326524 A1 | 12/2010 | Ihn | |
| 2011/0030879 A1 | 2/2011 | Veerasamy et al. | |
| 2011/0041980 A1 | 2/2011 | Kim et al. | |
| 2011/0077561 A1* | 3/2011 | Choly | 601/15 |
| 2011/0108102 A1* | 5/2011 | Wang et al. | 136/256 |
| 2011/0121273 A1* | 5/2011 | Jo et al. | 257/40 |
| 2011/0156059 A1* | 6/2011 | Reineke | H01L 51/5016 257/79 |
| 2011/0162687 A1* | 7/2011 | Moon et al. | 136/244 |
| 2011/0232742 A1* | 9/2011 | Warner et al. | 136/256 |
| 2012/0012790 A1* | 1/2012 | Nazeeruddin | C09K 11/06 252/301.35 |
| 2012/0075013 A1* | 3/2012 | Leo et al. | 327/584 |
| 2013/0069044 A1* | 3/2013 | Ma | H01L 51/5036 257/40 |

OTHER PUBLICATIONS

Bolotin, K. I, et al., "Ultrahigh electron mobility in suspended graphene", Solid State Communications, 146, (2008), 351-355.

Bonaccorso, F., et al., "Graphene photonics and optoelectronics", Nature Photonics, 4, (2010), 611-622.

Eda, G., et al., "Large-area ultrathin films of reduced graphene oxide as a transparent and flexible electronic material", Nature Nanotechnology, 3, (2008), 270-274.

Kavan, L., et al., "Optically transparent cathode for dye-sensitized solar cells based on graphene nanoplatelets", ACS Nano, 5(1), (2011), 165-172.

Kim, K. S, et al., "Large-scale pattern growth of graphene films for stretchable transparent electrodes", Nature, 457, (Feb. 5, 2009), 706-710.

Matyba, P., et al., "Graphene and mobile ions: the key to all-plastic, solution-processed light-emitting devices", ACS Nano, 4(2), (2010), 637-642.

Sirringhaus, Henning, et al., "Integrated Optoelectronic Devices Based on Conjugated Polymers", Science, 280(5370), (Jun. 12, 1998), 1741-1744.

Wang, G., et al., "Graphene nanosheets for enhanced lithium storage in lithium ion batteries", Carbon, 47(8), (2009), 2049-2053.

Wang, Xuan, et al., "Transparent, conductive graphene electrodes for dye-sensitized solar cells", Nano Lett., 8(1), (2008), 323-327.

"International Application Serial No. PCT/US2012/028299, International Search Report mailed Jul. 11, 2012", 4 pgs.

"International Application Serial No. PCT/US2012/028299, Written Opinion mailed Jul. 11, 2012", 11 pgs.

Cox, et al., "Single-layer graphene cathodes for organic photovoltaics", Applied Physics Letiers 98, 123303 (2011), (Mar. 23, 2011).

* cited by examiner

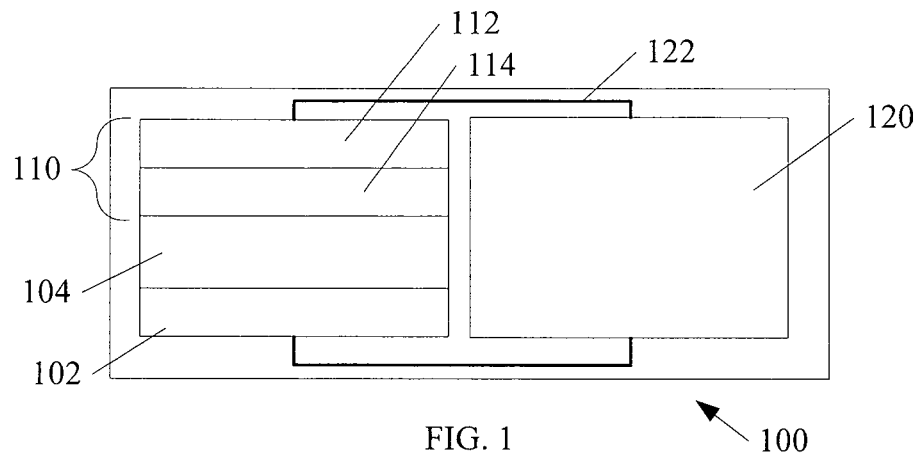
FIG. 1
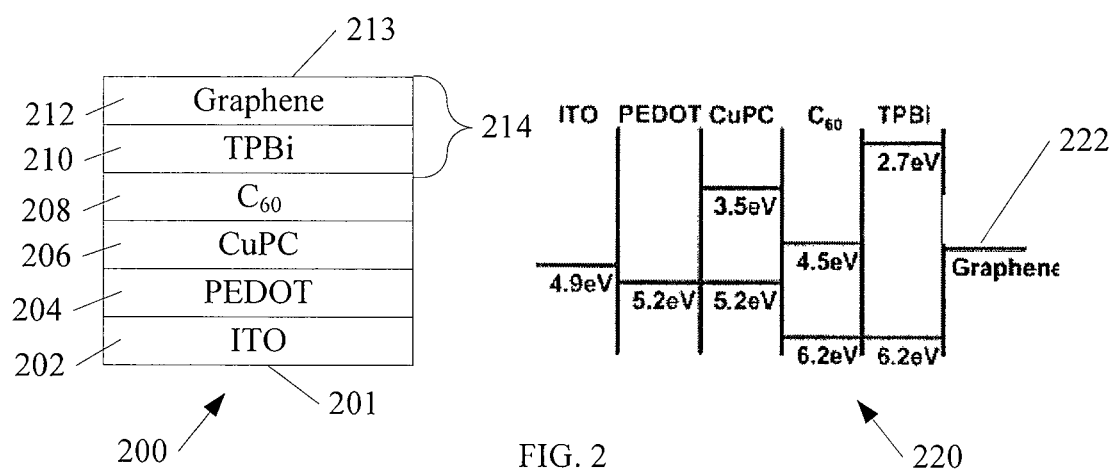
FIG. 2
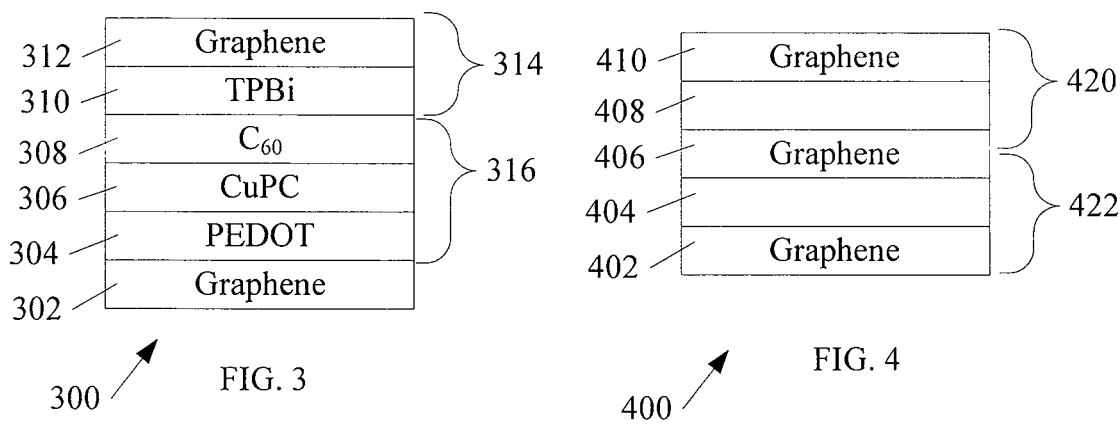
FIG. 3
FIG. 4

GRAPHENE ELECTRODES FOR ELECTRONIC DEVICES

CROSS-REFERENCE TO RELATED PATENT DOCUMENTS

This application is a U.S. National Stage Application filed under 35 U.S.C. 371 of International Application Serial No. PCT/US2012/028299, entitled "GRAPHENE ELECTRODES FOR ELECTRONIC DEVICES," filed on Mar. 8, 2012, and published on Sep. 13, 2012 as WO 2012/122387, which patent application claims the benefit of priority to U.S. Provisional Patent Application Ser. No. 61/451,329, entitled "GRAPHENE ELECTRODES FOR OPTOELECTRONIC DEVICE," filed on Mar. 10, 2011; all of which applications and publication are incorporated by reference herein in their entireties.

BACKGROUND

Graphene, a two-dimensional crystalline form of carbon, can provide high transparency, conductivity flexibility, and elemental abundance. Therefore, graphene can be an excellent replacement for transparent conducting oxide electrodes.

Overview

This document describes, among other things, a process and materials pairing for integrating graphene, the two-dimensional form of carbon, into electronic devices as a cathode. In some examples, the electronic devices include optoelectronic devices. Graphene has characteristics that are favorable for optoelectronic device integration, such as high room temperature carrier mobilities, high current densities, very high transparency, and mechanical flexibility. One approach to using graphene electrodes is to limits is use to an anode, as the work function of graphene lends itself most readily to hole injection, while its intrinsic physical fragility constrains integration processes. Most devices are built from the anode up, because it is difficult to deposit high-quality graphene on top of semiconducting materials as a cathode.

The present inventors have developed, among other things, a lamination process that can integrate graphene onto the top of a device, such as for use as a cathode, for example. Graphene can be either grown or transferred onto a soft stamp material (e.g., PDMS), which can then be laminated onto a nearly complete optoelectronic device. This can be accomplished via at least three distinct methods:

1) Transfer of graphene onto the top of a device via lamination of a PDMS "stamp" without the removal of the PDMS (this is useful since graphene adheres strongly to unmodified PDMS).

2) Transfer of graphene onto the top of a device and the subsequent removal of the PDMS stamp (transfer lamination). This process involves the chemical alteration of PDMS before the integration of graphene. This modification can be done via silane treatment or the deposition of a buffer layer. A single graphene layer of the type deposited here can be used as an electrode or as the recombination layer for a tandem solar cell.

3) Additional graphene transfer laminations (e.g., 2+). In a single graphene layer lamination the graphene typically has faults that limit its conductivity. This is because the graphene layer, in the absence of extremely high manufacturing quality (where step 2 would be sufficient), is composed of many broken pieces of graphene adjacent to each other. The conductivity between any adjacent graphene crystal is far inferior to that of single-crystalline graphene. To help circumvent this issue, an additional layer of graphene can be deposited in the same manner. This second layer will very likely bridge these domains with small domains of its own, increasing conductivity dramatically.

The transfer lamination of graphene can be formed into a device as the recombination layer of a solar cell.

The present electronic devices and methods utilizing graphene provide improvements in manufacturing and device performance. To better illustrate the electronic devices and methods utilizing graphene, a non-limiting list of examples is now provided:

An example can include subject matter (such as an apparatus, a method, a means for performing acts, or a machine-readable medium including instructions that, when performed by the machine, cause the machine to perform acts) that can include or use an electronic device as described. The electronic device can include an anode and a cathode structure. The cathode structure can include a single layer of graphene, and an electron acceptor material in contact with the single layer of graphene. An electronic element can be coupled between the anode and the cathode structure.

The electronic device can be optionally configured such that the electron acceptor material modifies a work function of the layer of graphene from approximately 4.6 eV to approximately 4.3 eV. The electronic device can be optionally configured as a tandem photocell. The electronic device can further include a shared graphene layer separating a top photovoltaic device and a bottom photovoltaic device in a tandem photocell. The electronic device can further include a second layer of graphene over the single layer of graphene to form a bi-layer structure. The electronic device can be optionally configured such that the electron acceptor material includes 1,3,5-tri(phenyl-2-benzimidazole)-benzene (TPBi). The electronic device can be optionally configured such that the electronic element includes a liquid crystal element. The electronic device can be optionally configured such that the electronic element is an optically active element. The electronic device can be optionally configured such that the optically active element includes an organic photovoltaic region. The electronic device can be optionally configured such that the organic photovoltaic element includes a heterojunction photovoltaic region. The electronic device can be optionally configured such that the electron acceptor material is located between the heterojunction photovoltaic region and the at least one layer of graphene. The electronic device can be optionally configured such that the heterojunction photovoltaic region includes a copper phtalocyanine (CuPC) to $C_{60}$ interface. The electronic device can be optionally configured such that the optically active element includes an organic light emitting element. The electronic device can be optionally configured such that the anode includes a single layer of graphene. The electronic device can be optionally configured such that the anode includes a bi-layer graphene structure. The electronic device can be optionally configured such that the anode includes indium tin oxide. The electronic device can be optionally configured such that the electronic device is configured as a photodiode. The electronic device can be configured as a photomultiplier. The electronic device can be configured as a touch screen user interface.

An example method of making an electronic device can include forming an electronic element over an anode. The method can include forming a cathode structure over the electronic element. Forming the cathode structure can include selecting a desired cathode work function. Forming the cathode structure can include coupling a single layer of graphene to an electron acceptor material to contact dope the single layer of graphene to modify the work function of the single layer of graphene towards the desired cathode work function. The method can include coupling the at least one layer of graphene to the electron acceptor material includes coupling at least one layer of graphene to a 1,3,5-tri(phenyl-2-benzimidazole)-benzene (TPBi) layer to modify the work function of graphene from approximately 4.6 eV to approximately 4.3 eV. The method can include coupling the at least one layer of graphene to the electron acceptor material includes physically transferring the at least one layer of graphene onto an electronic device stack. The method can include coupling a second layer of graphene to the single layer of graphene. The method can include physically transferring the at least one layer of graphene onto the electronic device stack includes transferring a lamination of polydimethylsiloxane (PDMS) and graphene onto a 1,3,5-tri(phenyl-2-benzimidazole)-benzene (TPBi) layer of the electronic device stack.

Each of these non-limiting examples can stand on its own, or can be combined with one or more of the other examples in any permutation or combination. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 1 shows an example of an electronic device according to an embodiment of the invention.

FIG. 2 shows an example of an optoelectronic device according to an embodiment of the invention.

FIG. 3 shows another example of an optoelectronic device according to an embodiment of the invention. FIG. 4 shows another example of an optoelectronic device according to an embodiment of the invention.

DETAILED DESCRIPTION

Figure 5:
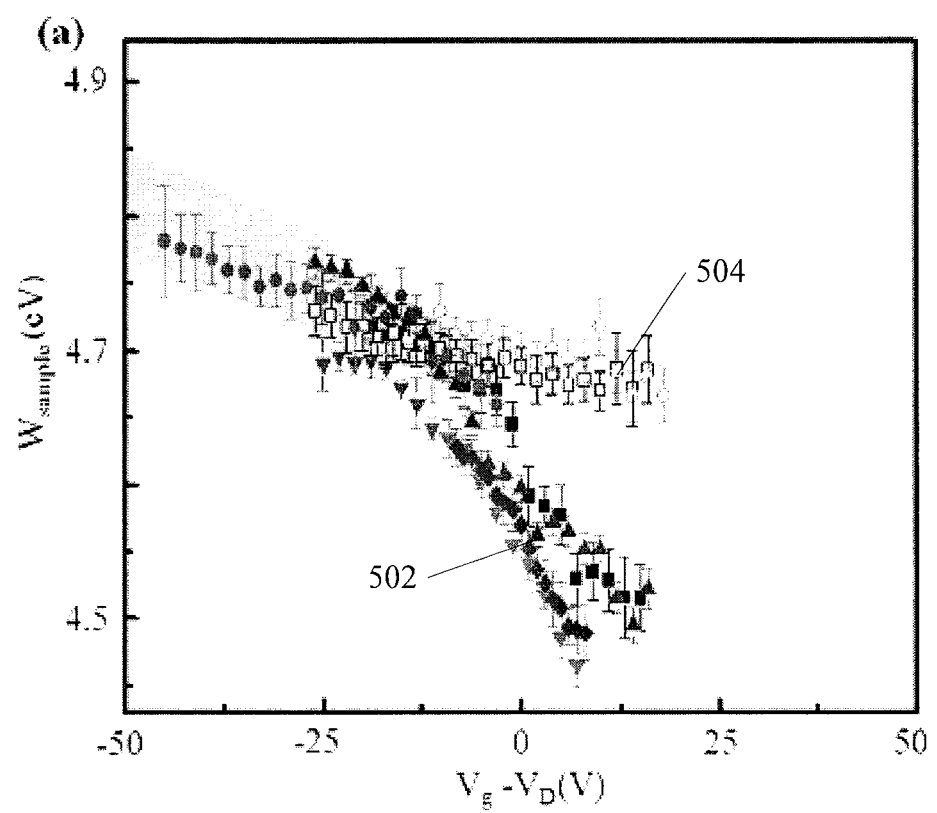
FIG. 5 shows work function modification of graphene according to an embodiment of the invention.

In some examples, graphene and graphene oxide can be used as anode materials in electronic devices, such as organic photovoltaic devices (OPVs). Here, we describe OPV devices, and other devices, that can include single-layer chemical vapor deposition (CVD) grown graphene as a cathode.

In one approach to using graphene as a cathode material, multi-layer graphene modified with a dipole layer served as the cathode in poly(3-hexylthiophene)/[6,6]-phenyl-C61-butyric acid methyl ester (P3HT/PCBM) OPVs. Interestingly, a photo response was observed for devices from dipole layer treated graphene, but not for devices from bare graphene. To understand this effect, it can be noted that as a result of graphene's small density of states around the Dirac point, single layer graphene exhibits a highly tunable work function that shifts when it contacts other materials. Furthermore, in PCBM:P3HT bulk heterojunctions, the P3HT segregates at electrode surfaces. Therefore, when bare graphene comes into contact with an electron donor (P3HT) charge transfer will "contact dope" the cathode or raise its work function. This effect would not be expected for graphene treated with a dipole layer.

FIG. 1 shows an example electronic device 100 according to an embodiment of the invention. The electronic device 100 includes an anode 102 and a cathode structure 110, with a electronic element 104 couple between the anode 102 and the cathode structure 110. Additional components 120 may also be included in the electronic device 100, coupled by circuitry 122.

Several types of electronic devices may be formed according to examples of the invention. In one example, the electronic element 104 includes a liquid crystal element. In one example, the electronic element 104 includes a conducting polymer element. In one example, the electronic element 104 is configured to provide a user interface, such as a touch screen interface for a mobile device or tablet computer.

In one example, the electronic device 100 includes an optoelectronic device. Examples of optoelectronic devices may include the example devices listed above, and/or additional devices. In one example, the electronic element 104 includes a light emitting region. In one example, the electronic element 104 includes an organic light emitting region.

In one example, the electronic element 104 includes a photovoltaic region. In one specific example, the photovoltaic region includes an organic photovoltaic region. Examples of organic photovoltaic regions include, but are not limited to, bi-layer organic photovoltaic regions and heterojunction photovoltaic regions.

In one example the cathode structure 110 includes a single layer of graphene 112. In some examples, the a single layer of graphene 112 further includes a second layer of graphene to form a bi-layer structure of graphene. Two layers can be used to increase conductivity within the cathode structure 110. For example, a single layer of graphene may include discontinuities such as cracks that can disrupt conduction. In one example a second layer of graphene are used to bridge discontinuities in a single layer of graphene, thus increasing conductivity in the cathode structure 110.

The above examples describe a single layer of graphene and a bi-layer graphene structure. In some examples, work function modification (as described in more detail below) is most effective for a single layer structure. In some examples, the work function modification effect is still present, though less pronounced in a bi-layer structure. In some examples, work function modification becomes less effective for graphene laminations greater than two layers.

In the example of FIG. 1, the cathode structure 110 further includes an electron acceptor material 114 in contact with the single layer of graphene 112. In one example, the contact of the electron acceptor material 114 with the single layer of graphene 112 modifies a work function of the graphene. In many electronic devices, performance of the device is affected by a work function of the cathode structure. For example in an organic photovoltaic device, in order to form an ohmic contact with a semiconducting region, a work function of an electrode such as an anode 102 or cathode structure 110 is desired that is close to or matching a work function of the semiconducting region.

In one example, the electron acceptor material 114 is chosen to modify the work function of the layer of graphene 112 to approximately match a work function of an adjacent material in the electronic element 104. In one example, the electron acceptor material 114 modifies a work function of the layer of graphene 112 from approximately 4.6 eV to approximately 4.3 eV.

One specific example of modification of the work function of graphene to form a cathode structure 110 is described with regard to FIG. 2 below. To demonstrate the utility of contact doping, we fabricated an OPV device 200 with laminated graphene cathodes 214.

Pre-patterned indium-tin-oxide (ITO) substrates 202 (e.g., from Luminescence Technology Corporation) were solvent cleaned, exposed to UV-ozone (e.g., Jelight UVO cleaner) for 10 minutes, and coated with a PEDOT layer 204 (e.g., HC Starck) at 3000 rpm for 60 seconds. The samples were baked at 120 C for 45 minutes and then transferred into a nitrogen glove box coupled vacuum deposition system (e.g., Angstrom Engineering) for device fabrication. In an example, 40 nm of a copper phthalocyanine (CuPC) layer 206, 40 nm of a $C_{60}$ layer 208, and 10 nm of a 1,3,5-tri(phenyl-2-benzimidazole)-benzene (TPBi) layer 210 were evaporated in succession to form the device stack.

To complete the devices, in an example, the electrodes were fabricated as follows. For the graphene devices, graphene was grown via CVD and transferred to a polydimethylsiloxane (PDMS, e.g., Sylgard 184) substrate. This graphene/PDMS "stamp" was used to laminate the graphene cathode, yielding an active area of 0.4 $cm^2$.

To test the properties of the device 200, an aluminum cathode device was formed and data was compared between the aluminum cathode and the device 200 with the graphene cathode structure 214 as described. For the aluminum control devices, 60 nm of Al was evaporated as a cathode, yielding an active area of 0.16 $cm^2$. I-V measurements were performed under AM1.5 solar simulated illumination in a nitrogen environment and under various monochromatic (e.g., 620 nm) LED intensities (e.g., using the Luminus Devices Phlat Light PT-120-R) in ambient.

FIG. 2 further shows a chart 220 of work functions in components of the OPV device 200. The highest occupied molecular orbital (HOMO) and the lowest unoccupied molecular orbital (LUMO) of the OPV device 200 are shown, with values equal to the energy below the vacuum level. The work function 222 of the graphene layer 212 is modified as a result of contact doping with the 1,3,5-tri(phenyl-2-benzimidazole)-benzene (TPBi) layer 210. Although a 1,3,5-tri(phenyl-2-benzimidazole)-benzene (TPBi) layer is used as an example, other electron acceptor materials may be used to modify the work function 222 of the graphene 212.

A chosen work function 222 for the graphene 212 will depend on a specific electronic device configuration. In the OPV example of FIG. 2, a work function of graphene 212 is modified from approximately 4.6 eV to approximately 4.3 eV. The modified work function closely matches the work function of the $C_{60}$ layer 208, shown at approximately 4.5 eV. In other devices, or with other material choices, the work function 222 of the graphene 212 may be modified to a different value, by choice of a different electron acceptor material placed in contact with the graphene 212.

In the example of FIG. 2, the graphene cathode structure 214 is located on a top 213 of a device stack with the ITO anode 202 on a bottom 201 of the stack. In one example a configuration with the graphene cathode structure 214 located on a top of the device 200 is facilitated by the physical transfer of a separately formed graphene layer 212 to the device 200. As described above, in one example, a lamination of polydimethylsiloxane (PDMS) and graphene are used to physical transfer a separately formed graphene layer 212 to the device 200. In one example multiple layers of graphene are laminated to the graphene cathode structure 214 using multiple physical transfers of a separately formed graphene layer.

In the example of FIG. 2, the graphene layer 212 is located over the electron acceptor material (the 1,3,5-tri(phenyl-2-benzimidazole)-benzene (TPBi) layer 210 in FIG. 2). In such an example, the electron acceptor material is interposed between the graphene 212 and the other active structures within the device 200. In another example, the electron acceptor material is located on top 213 of the graphene layer 212, and the work function modification of the graphene occurs without interposing the electron acceptor material between the graphene and the other active structures within the device 200.

FIG. 3 shows another example of an electronic device 300. The device 300 includes an anode 302 including graphene, a graphene cathode structure 314 similar to examples described above, and an electronic element region 316 located between the anode 302 and the graphene cathode structure 314. In one example, the electronic element region 316 includes a photovoltaic region including a layer of PEDOT 304, a layer of CuPC 306 and a layer of $C_{60}$ (308) similar to examples described above. In other examples, the electronic element region 316 includes other structures such as liquid crystal structures, light emitting structures to form a light emitting diode, touch sensor structures, etc. By using graphene in the anode 302, an all organic device 300 may be formed. All organic devices 300 may include certain desirable properties over metallic devices, such as flexibility and durability.

FIG. 4 shows a multilevel photocell device 400 that may be formed using work function modification of a graphene layer as described in embodiments above. In the example shown, a top photovoltaic device 420 and a bottom photovoltaic device 422 are separated by a shared graphene layer 406. Although a tandem photocell device is shown, other multilevel photocell devices 400 including more than two photovoltaic devices are within the scope of the invention.

The top photovoltaic device 420 of FIG. 4 includes a graphene electrode 410 and a photovoltaic junction region 408 sandwiched between the graphene electrode 410 and the shared graphene layer 406. Similarly, the bottom photovoltaic device 422 includes a graphene electrode 402 and a photovoltaic junction region 404 sandwiched between the graphene electrode 402 and the shared graphene layer 406.

In one example, one or more of the graphene layers 402, 406, 410, includes a modification layer to modify a work function of one or more of the graphene layers 402, 406, 410. In one example, a work function of one or more of the graphene layers 402, 406, 410 is modified as a result of contact doping with the 1,3,5-tri(phenyl-2-benzimidazole)-benzene (TPBi) layer as shown in examples above. Although a 1,3,5-tri(phenyl-2-benzimidazole)-benzene (TPBi) layer is used as an example, other electron acceptor materials may be used to modify the work function one or more of the graphene layers 402, 406, 410. A chosen work function for a given graphene layer will depend on a specific electronic device configuration.

Figure 6:
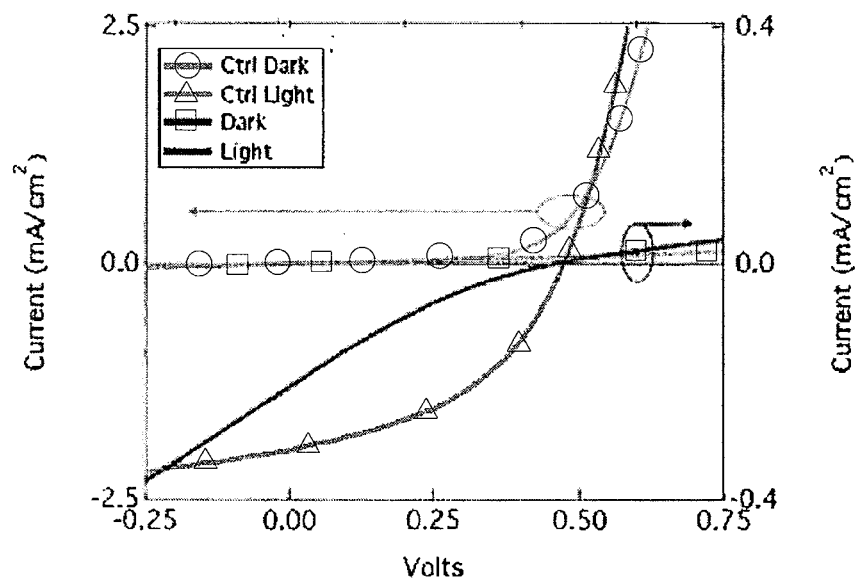
FIG. 6 shows I-V curves of selected device according to an embodiment of the invention.

In one example a work function modification of the shared graphene layer 406 in a multilevel photocell device 400 provides high lateral conduction, along with high transparency. In contrast, very thin metal layers used as an intermediate electrode are limited in both transparency and lateral conductivity. This property of graphene, modified as in the present disclosure, provides a unique ability of the multilevel photocell device 400 to function without matched current in both the top photovoltaic device 420 and the bottom photovoltaic device 422. FIG. 5 shows measured work function of single layer graphene (SLG) samples (filled symbols) and bi-layer graphene (BLG) samples (open symbols) as a function of a modification material located adjacent to the graphene layer(s). In the example shown, the data was collected by varying a gate voltage ($V_g$) adjacent to the graphene layer(s). FIG. 5 demonstrates the ability of contact doping to modify a work function of SLG and BLG structures. SLG samples 502 show larger work function changes while the BLG samples 504 exhibit fewer changes, where shaded areas indicate the uncertainty for the work function offset due to the adsorbate induced surface dipole layers. The filled symbols are SLG data taken in air. Other data were taken in a dry nitrogen environment. FIG. 6 shows typical I-V curves for graphene and aluminum cathode devices (e.g., 100 mW/cm²), which clearly indicate that these graphene cathode devices function as solar cells in the absence of chemical doping or work-function matching. The graphene devices exhibit a power efficiency of 0.02%, and the aluminum controls exhibit a power conversion efficiency of 0.41%. The open circuit voltage (VOC) for both types of devices is approximately 0.45V. This large efficiency disparity in conjunction with similar VOCs indicates that parasitic series resistances dominate the characteristics of the graphene devices. To quantify the differences between aluminum and graphene cathode devices, both data sets were fit to the ideal diode equation. The fit yielded a series resistance of 700Ω and a shunt resistance of 10 kΩ in the control devices versus a series resistance 10.5 kΩ and shunt resistance of 3.5 kΩ for the graphene cathode devices. The large parasitic resistances of the graphene devices directly induce lower efficiencies due to poor fill-factors under solar illumination. This observation is analogous to the series resistance/fill factor degradation found in few-layer graphene anode devices.

Figure 7:
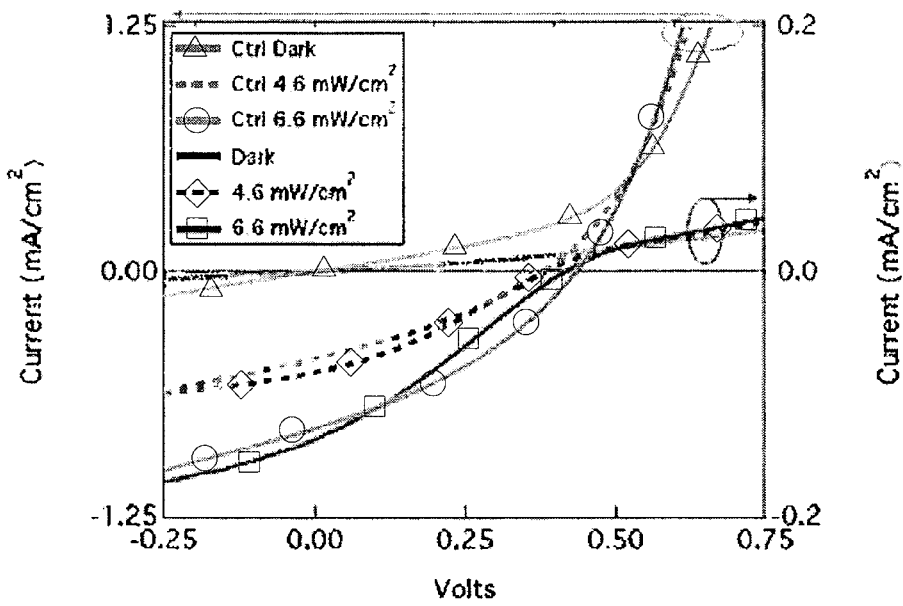
FIG. 7 shows I-V curves of selected device under monochromatic illumination according to an embodiment of the invention.

To minimize the influence of the parasitic series resistance, we probed the devices under low-intensity monochromatic illumination as shown in FIG. 7. At an incident power of 4.6 mW/cm², the graphene device exhibits a power conversion efficiency of 0.22% and a VOC of 0.38V, while the aluminum cathode device exhibits a power conversion efficiency of 1.19% and a VOC of 0.38V. At an incident power of 6.6 mW/cm², the graphene device exhibits a power conversion efficiency of 0.24% and a VOC of 0.40V, while the aluminum device exhibits a power conversion efficiency of 1.84% and a VOC of 0.43V. Given the 0.3 eV difference between the work functions of graphene and aluminum, the nearly identical VOC values can only be the result of graphene undergoing contact doping and adjusting its work function upon contact with a strong electron acceptor (TPBi).

The optical transparency of graphene also enabled us to compare device performance with both anode and cathode side illumination. The power conversion efficiency was 0.01% for anode-side solar illumination and 0.03% for cathode-side solar illumination. In addition, the power conversion efficiency was 0.24% for anode-side monochromatic illumination (6.57 mW/cm2) and 0.41% for cathode-side monochromatic illumination (6.57 mW/cm2). These differences in device performance were due to an increase in the short circuit current density for cathode-side illumination. We attribute this difference to the strong absorbance of CuPC. Anode side illumination results in the majority of excitons being formed at the PEDOT/CuPC junction, which is not within an exciton diffusion length of the power producing CuPC/C60 interface. Cathode side illumination results in the majority of excitons being produced at the energy producing CuPC/C60 heterojunction. This leads to an increase in efficiency for cathode side illumination relative to anode side illumination.

Figure 8:
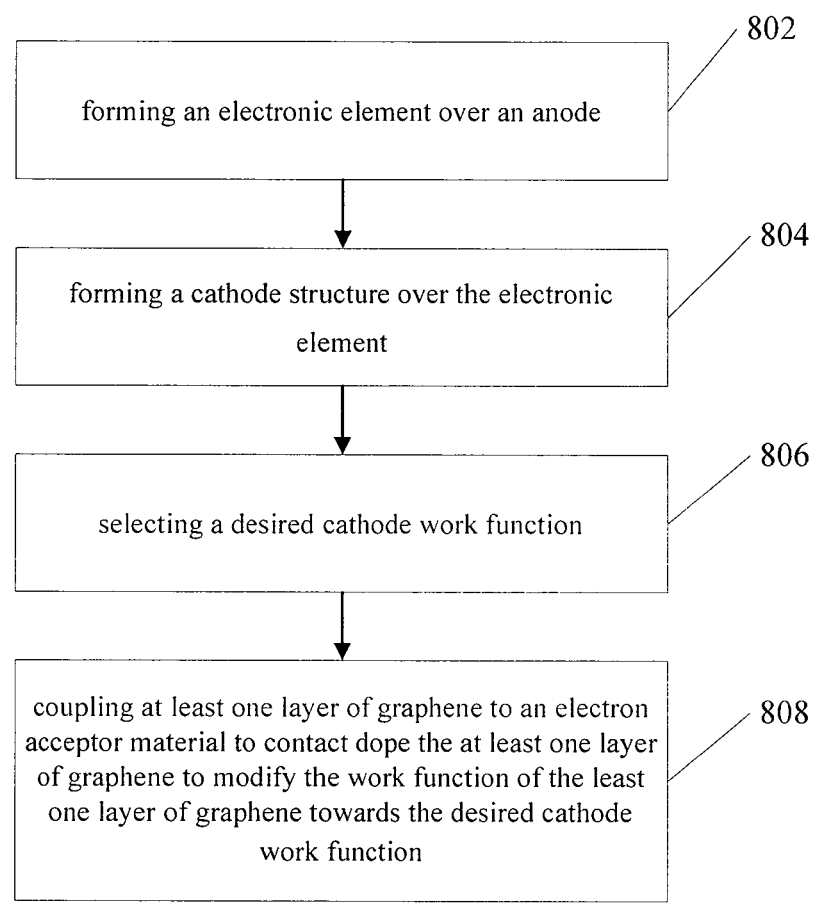
FIG. 8 shows an example method of forming an electronic device according to an embodiment of the invention.

FIG. 8 shows an example method of forming a device according to an embodiment of the invention. In operation 802, an electronic element is formed over an anode. In operation 804, a cathode structure is formed over the electronic element. In operation 806, a desired cathode work function is selected. In operation 808, at least one layer of graphene is coupled to an electron acceptor material to contact dope the at least one layer of graphene to modify the work function of the least one layer of graphene towards the desired cathode work function.

We have demonstrated that single-layer graphene undergoes contact doping and can serve as cathodes in OPVs. The power conversion efficiencies of graphene devices can be limited by their series resistance, indicating that the preparation of graphene samples with lower sheet resistances could improve device performance. The VOCs of our devices indicated that the work functions of graphene sheets shift when placed in contact with electron-donating material. This type of contact doping is a potentially valuable characteristic. The transparency of graphene also enabled us to demonstrate a simple strategy for doubling the efficiency of OPVs. The demonstration of a functioning graphene cathode device allows for the fabrication of all-graphene electrode devices. These findings favorably indicate the possibility of fabricating metal free, truly organic solar cells with graphene as a cathode and anode.

Various Notes & Examples

Example 1 can include subject matter (such as an apparatus, a method, a means for performing acts) that can include or use an electronic device. The electronic device can include an anode. The electronic device can include a cathode structure. The cathode structure can include a single layer of graphene. The cathode structure can include an electron acceptor material in contact with the single layer of graphene. The electronic device can include an electronic element coupled between the anode and the cathode structure.

Example 2 can include, or can optionally be combined with the subject matter of Example 1 to include the electron acceptor material modifies a work function of the layer of graphene from approximately 4.6 eV to approximately 4.3 eV.

Example 3 can include, or can optionally be combined with the subject matter of any one or more of Examples 1 or 2 to include the electronic device configured as a tandem photocell.

Example 4 can include, or can optionally be combined with the subject matter of any one or more of Examples 1 through 3 to include a shared graphene layer separating a top photovoltaic device and a bottom photovoltaic device in the tandem photocell.

Example 5 can include, or can optionally be combined with the subject matter of any one or more of Examples 1 through 4 to include a second layer of graphene over the single layer of graphene to form a bi-layer structure.

Example 6 can include, or can optionally be combined with the subject matter of any one or more of Examples 1 through 5 to include the electron acceptor material including 1,3,5-tri(phenyl-2-benzimidazole)-benzene (TPBi).

Example 7 can include, or can optionally be combined with the subject matter of any one or more of Examples 1 through 6 to include the electronic element including a liquid crystal element.

Example 8 can include, or can optionally be combined with the subject matter of any one or more of Examples 1 through 7 to include the electronic element as an optically active element.

Example 9 can include, or can optionally be combined with the subject matter of any one or more of Examples 1 through 8 to include the optically active element including an organic photovoltaic region.

Example 10 can include, or can optionally be combined with the subject matter of any one or more of Examples 1 through 9 to include the organic photovoltaic element including a heterojunction photovoltaic region.

Example 11 can include, or can optionally be combined with the subject matter of any one or more of Examples 1 through 10 to include the electron acceptor material located between the heterojunction photovoltaic region and the at least one layer of graphene.

Example 12 can include, or can optionally be combined with the subject matter of any one or more of Examples 1 through 11 to include the heterojunction photovoltaic region including a copper phtalocyanine (CuPC) to $C_{60}$ interface.

Example 13 can include, or can optionally be combined with the subject matter of any one or more of Examples 1 through 12 to include the optically active element including an organic light emitting element.

Example 14 can include, or can optionally be combined with the subject matter of any one or more of Examples 1 through 13 to include the anode including a single layer of graphene.

Example 15 can include, or can optionally be combined with the subject matter of any one or more of Examples 1 through 14 to include the anode including a bi-layer graphene structure.

Example 16 can include, or can optionally be combined with the subject matter of any one or more of Examples 1 through 15 to include the anode including indium tin oxide.

Example 17 can include, or can optionally be combined with the subject matter of any one or more of Examples 1 through 16 to include the electronic device configured as a photodiode.

Example 18 can include, or can optionally be combined with the subject matter of any one or more of Examples 1 through 19 to include the electronic device configured as a photomultiplier.

Example 19 can include, or can optionally be combined with the subject matter of any one or more of Examples 1 through 18 to include the electronic device configured as a touch screen user interface.

Example 20 can include a method of making an electronic device. The method can include forming an electronic element over an anode. The method can include forming a cathode structure over the electronic element. Forming the cathode structure can include selecting a desired cathode work function. Forming the cathode structure can include coupling a single layer of graphene to an electron acceptor material to contact dope the single layer of graphene to modify the work function of the single layer of graphene towards the desired cathode work function.

Example 21 can include, or can optionally be combined with the subject matter of Example 20 to include coupling the single layer of graphene to the electron acceptor material includes coupling the single layer of graphene to a 1,3,5-tri(phenyl-2-benzimidazole)-benzene (TPBi) layer to modify the work function of graphene from approximately 4.6 eV to approximately 4.3 eV.

Example 22 can include, or can optionally be combined with the subject matter of any one or more of Examples 20 through 21 to include coupling the single layer of graphene to the electron acceptor material includes physically transferring the at least one layer of graphene onto an electronic device stack.

Example 23 can include, or can optionally be combined with the subject matter of any one or more of Examples 20 through 22 to include coupling a second layer of graphene to the single layer of graphene.

Example 23 can include, or can optionally be combined with the subject matter of any one or more of Examples 20 through 22 to include physically transferring the single layer of graphene onto the electronic device stack includes transferring a lamination of polydimethylsiloxane (PDMS) and graphene onto a 1,3,5-tri(phenyl-2-benzimidazole)-benzene (TPBi) layer of the electronic device stack.

Example 24 can include, or can optionally be combined with the subject matter of any one or more of Examples 20 through 23 to include coupling a second layer of graphene to the single layer of graphene.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electronic device, comprising:
    an anode;
    a semiconductor material of an electronic element deposited over the anode;
    a cathode structure located on top of the electronic element and deposited over the semiconductor material, the cathode structure including:
        a single layer of planar graphene;
        an electron acceptor material in contact with the single layer of graphene, wherein the electron acceptor material includes 1,3,5-tri (phenyl-2-benzimidazole)-benzene (TPBi), and wherein the electron acceptor material modifies a work function of the layer of graphene from approximately 4.6 eV to approximately 4.3 eV.

2. The electronic device of claim 1, wherein the electronic device is configured as a tandem photocell.

3. The electronic device of claim 2, further including a shared graphene layer separating a top photovoltaic device and a bottom photovoltaic device in the tandem photocell.

4. The electronic device of claim 1, further including a second layer of planar graphene over the single layer of planar graphene to form a bi-layer structure.

5. The electronic device of claim 1, wherein the electronic element includes a liquid crystal element.

6. The electronic device of claim 1, wherein the electronic element is an optically active element.

7. The electronic device of claim 6, wherein the optically active element includes an organic light emitting element.

8. The electronic device of claim 1, wherein the optically active element includes an organic photovoltaic region.

9. The electronic device of claim 8, wherein the organic photovoltaic region includes a heterojunction photovoltaic region.

10. The electronic device of claim 9, wherein the electron acceptor material is located between the heterojunction photovoltaic region and the single layer of planar graphene.

11. The electronic device of claim 9, wherein the heterojunction photovoltaic region includes a copper pthalocyanine (CuPC) to $C_{60}$ interface.

12. The electronic device of claim 1, wherein the anode includes a single layer of planar graphene.

13. The electronic device of claim 1, wherein the anode includes a bi-layer graphene structure.

14. The electronic device of claim 1, wherein the anode includes indium tin oxide.

15. The electronic device of claim 1, wherein the electronic device is configured as a photodiode.

16. The electronic device of claim 1, wherein the electronic device is configured as a photomultiplier.

17. The electronic device of claim 1, wherein the electronic device is configured as a touch screen user interface.

18. A method of making an electronic device, comprising:
    forming an electronic element, comprising a semiconductor material, over an anode;
    forming a cathode structure over the electronic element, including:
        selecting a target cathode work function; and
        coupling a single layer of planar graphene to an electron acceptor material to contact dope the single layer of graphene to modify the work function of the single layer of graphene towards the target cathode work function;
    wherein the electron acceptor material includes 1,3,5-tri (phenyl-2-benzimidazole)-benzene (TPBi), and wherein the electron acceptor material modifies a work function of the layer of graphene from approximately 4.6 eV to approximately 4.3 eV.

19. The method of claim 18, wherein coupling the single layer of planar graphene to the electron acceptor material includes physically transferring the single layer of planar graphene onto the stack of the electronic element and anode.

20. The method of claim 19, wherein physically transferring the single layer of planar graphene includes transferring a lamination of polydimethylsiloxane (PDMS) and graphene onto the 1,3,5-tri(phenyl-2-benzimidazole)-benzene (TPBi).

21. The method of claim 18, further including coupling a second layer of planar graphene to the single layer of planar graphene.

* * * * *